United States Patent [19]

Pan et al.

[11] Patent Number: 5,008,689

[45] Date of Patent: Apr. 16, 1991

[54] PLASTIC SUBSTRATE FOR THERMAL INK JET PRINTER

[75] Inventors: Alfred I-Tsung Pan, Sunnyvale; Eric G. Hanson, Burlingame; Christopher A. Schantz, Redwood City; Winthrop D. Childers, San Diego, all of Calif.

[73] Assignee: Hewlett-Packard Company, Palo Alto, Calif.

[21] Appl. No.: 491,141

[22] Filed: Mar. 9, 1990

Related U.S. Application Data

[63] Continuation-in-part of Ser. No. 168,718, Mar. 16, 1988, Pat. No. 4,926,197.

[51] Int. Cl.$^5$ ............................................. B41J 2/05
[52] U.S. Cl. ................................. 346/140 R; 361/387
[58] Field of Search .................. 346/140; 361/387; 437/902

[56] References Cited

U.S. PATENT DOCUMENTS 4,926,197 5/1990 Childers ........................... 346/140

Primary Examiner—Joseph W. Hartary

[57] ABSTRACT

A substrate for the print head of an ink jet printer includes a plastic base, a metallization layer overlying the plastic base, and a dielectric structure overlying the metallization layer. A thin film resistor is deposited over the substrate, as required. Preferred materials include polyimide plastic for the base, chromium for the metallization layer, and a bilayer construction of silicon dioxide overlying titanium for the dielectric structure.

19 Claims, 1 Drawing Sheet

PLASTIC SUBSTRATE FOR THERMAL INK JET PRINTER

This application is a continuation in part of application Ser. No. 07/168,718, filed Mar. 16, 1988, now U.S. Pat. No. 4,926,197, for which priority is claimed.

BACKGROUND OF THE INVENTION

This invention relates to printers, and, more particularly, to the substrate component of the print head of thermal ink jet printers.

Thermal ink jet print heads operate by rapidly heating a small volume of ink, causing it to vaporize and expand, and ejecting the ink through an orifice to strike a piece of paper. When a number of orifices are properly arranged, they form a dot matrix pattern. The properly sequenced operation of each orifice causes a pattern of characters or images to be printed upon the paper as the print head is moved past the paper. The thermal ink jet printer is fast but quiet, as only the ink strikes the paper, produces high quality printing, and can be made compact and portable.

In one design, the print head includes an ink reservoir and channels to supply the ink to the point of vaporization, an orifice plate in which the individual orifices are formed in the required pattern, a series of thin film heaters, one below each orifice, and a substrate which forms the back wall of the ink channel and upon which the heaters are supported. Each heater includes a thin film resistor and appropriate current leads. To print a single dot of ink, electrical current from an external power supply is passed through a selected heater. The heater is ohmically heated, in turn heating the adjacent ink and causing a droplet of ink to be ejected through the adjacent orifice to the paper.

The present invention is concerned with the construction of the substrate. The substrate supports the resistors and their current carrying leads, and must therefore be electrically nonconducting in the sense of serving as an insulator between the laterally adjacent resistors and leads. The substrate must have a sufficiently low thermal conductivity to limit the portion of the heat pulse of the resistors conducted into the substrate. Otherwise, excessive driving energy may be required. In addition, the substrate must have good mechanical strength to withstand the hydrodynamic forces produced during the ink ejection cycle.

Substrates have been conventionally fabricated from pieces of silicon or glass, covered with a dielectric layer such as silicon dioxide. These constructions are fully operable and acceptable. Nevertheless, there is a continuing need for improved substrate materials and designs that permit less costly fabrication and better performance of the substrate and the print head. The present invention fulfills this need, and further provides related advantages.

SUMMARY OF THE INVENTION

The present invention resides in an improved substrate material and construction that provides both operational and cost advantages over prior substrates. As compared with prior substrate constructions, the improved substrate is more readily configured by secondary fabrication. Electrical interconnections for the heater circuits are simplified. The substrate is less costly to fabricate, due to the use of less expensive materials, and due to use of a semi-continuous processing procedure rather than a batch procedure. These cost considerations are particularly important because the print head is disposable.

In accordance with the invention, a thermal ink jet printer print head comprises a plastic base; a metallization layer overlying the plastic base, the metallization layer having a thickness of from about 50 Angstroms to about 1000 Angstroms; a dielectric structure overlying the metallization layer, the dielectric structure including a metallic buffer layer overlying the metallization layer, the buffer layer having a thickness of greater than about 700 Angstroms, and a layer of a dielectric material overlying the metallic buffer layer; and means overlying the dielectric structure for ejecting a droplet of ink. The base is preferably a polyimide plastic, and the metallization layer is preferably chromium deposited upon the plastic. The dielectric structure may include a single layer of dielectric material or multiple layers, at least one of which is a dielectric. The dielectric structure includes a thin metallic buffer layer, preferably titanium, overlying the metallization layer, and a layer of a dielectric material, such as silicon dioxide, overlying the buffer layer.

The present substrate replaces glass or silicon, as used in prior substrates, with plastic. The benefits of the present invention flow from this selection of a plastic base. The use of plastic was not previously possible, due to its low thermal conductivity, about 1/5 that of glass and 1/400 that of silicon, and because dielectric materials do not readily adhere to the plastic. The addition of the thermally conductive metallization layer and the buffer layer, between the plastic base and the dielectric structure, provides a degree of thermal conductivity to dissipate heat produced by the operation of the thin-film heaters and also effects adhesion of the dielectric layer to the plastic base. The metallization layer is electrically isolated from the thin-film heater by the dielectric structure, so that the substrate is sufficiently electrically nonconductive for the heaters to be operated independently of each other.

The metallization layer and the dielectric structure have maximum service temperatures higher than the peak resistor temperatures. The addition of the metallization layer of suitable thickness and the dielectric structure of suitable thickness, between the plastic base and the resistor, permits the use of plastics having maximum service temperatures lower than the peak resistor temperature. The use of such plastics in the base was not previously possible.

The present invention provides an important advance in the art of thermal ink jet printers. By separating the thermal conductivity and electrical insulation functions and providing those functions in an alternate construction, improved performance, improved fabricability, and reduced cost have been achieved. Print heads not realistically possible with other substrate materials can be constructed, such as large array print heads that are as wide as a page so that entire lines can be printed simultaneously. Other features and advantages will be apparent from the following more detailed description of the preferred embodiment, taken in conjuction with the accompanying drawings, which illustrate, by way of example, the principles of the invention.

DETAILED DESCRIPTION OF THE PREFERRED EMBODIMENT

Figure 1:
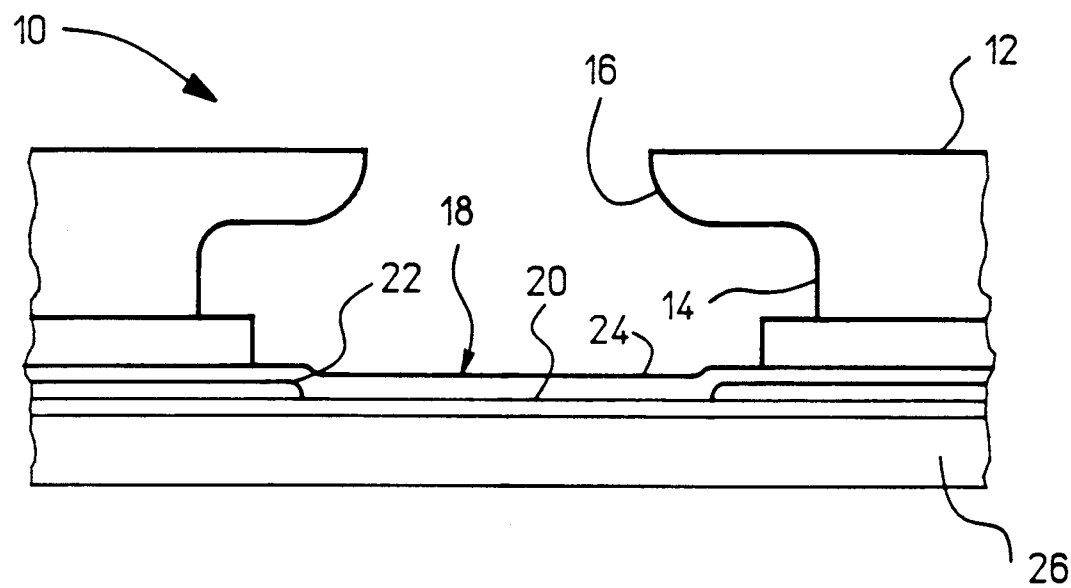
FIG. 1 is a diagrammatic side sectional view of a detail of a thermal ink jet print head.

A portion of a thermal ink jet printer head is presented in FIG. 1, showing the relation of the substrate to other major components. Referring to FIG. 1, a thermal ink jet printer head 10 includes an orifice plate 12 having an ink channel 14 therein. The orifice plate 12 has a number of orifices, including the illustrated orifice 16. Ink is drawn from a reservoir (not shown) to the region of the orifice 16 through the ink channel 14, by capillary action.

Opposite the opening of the orifice 16 is a heater 18. The heater 18 is a thin film resistor including a tantalum-aluminum planar resistor element 20 and aluminum or gold leads 22 connecting to the resistor element 20. A current is passed through the portion of the resistor element 20 between the ends of the leads 22, rapidly heating the resistor element. A small volume of ink adjacent the heater 18 is thereby rapidly heated and vaporized, causing some of the ink in the channel 14 to be ejected through the orifice 16. A passivation layer 24 overlies the heater 18, to protect it from corrosion by the ink. The passivation layer 24 is optional, and need not be used.

In accordance with a preferred embodiment of the invention, a thermal ink jet printer print head comprises a plastic base; a chromium layer overlying the plastic base, the chromium layer having a thickness of from about 50 Angstroms to about 1000 Angstroms; a dielectric structure overlying the chromium layer, the dielectric structure including a titanium layer overlying the chromium layer, the titanium layer having a thickness of from about 700 to about 3000 Angstroms, and a layer of a dielectric material overlying the titanium layer, the dielectric material having a thickness of from about 0.1 to about 10 micrometers and being selected from the group consisting of aluminum oxide and silicon dioxide; and means overlying the dielectric structure for ejecting a droplet of ink.

Figure 2:
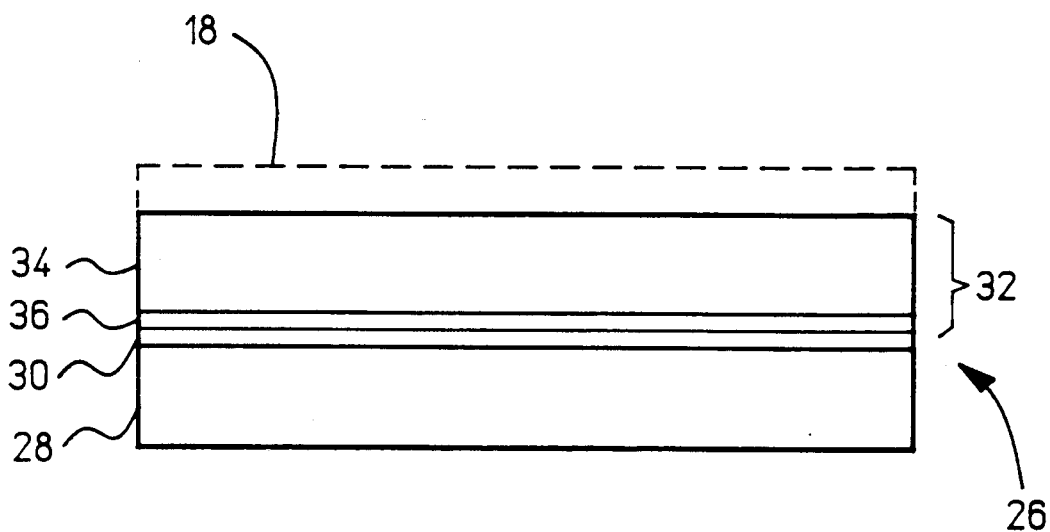
FIG. 2 is an enlarged side elevational view of the preferred construction of the substrate.

The heater 18 is supported on a substrate 26, which is shown in greater detail in FIG. 2, along with the overlying heater 18. (In FIG. 2, the elements are not illustrated to scale.) The substrate 26 includes a plastic base 28, preferably formed of a polyimide plastic such as DuPont Kapton. The base can be of any required thickness, but is preferably from about 25 micrometers to about 3000 micrometers thick, most preferably from about 50 micrometers to about 300 micrometers thick. Plastic sheet of this thickness is available commercially on rolls, which can then be fabricated.

Overlying the base 28 is a metallization layer 30, preferably made of chromium. The term "overlying" as used herein means that one layer is positioned over and in intimate contact with a second layer or structure. In this instance, the metallization layer 30 overlies the base 28. The metallization layer is preferably from about 50 Angstroms to about 1000 Angstroms thick, most preferably about 400 Angstroms thick. The metallization layer 30 aids in bonding the overlying structure to the base 28, and to some extent acts as a heat sink.

Overlying the metallization layer 30 is a dielectric structure 32. The dielectric structure 32 includes a dielectric layer 34 of a material that has a low electrical conductivity. The preferred material for the dielectric layer is aluminum oxide or silicon dioxide, which have been previously used in substrate construction to achieve a controlled rate of heat loss from the resistor element to the underlying structure and as a mass diffusion barrier to prevent leaching of impurities. In its present application, the dielectric layer also electrically insulates the various resistor elements 20 and leads 22 from each other. The dielectric layer 34 is preferably from about 0.1 to about 10 micrometers in thickness, most preferably about 0.6 micrometers (6000 Angstroms) in thickness. However, greater thicknesses are not excluded.

Between the dielectric layer 34 and the metallization layer 30 is a buffer layer 36. The buffer layer 36 is preferably a layer of titanium from about 700 to about 3000 Angstroms thick, most preferably about 1500 Angstroms thick, which buffers the high tensile stress of the metallization layer 30. In the absence of the buffer layer 36, this high tensile stress will crack the dielectric layer 34. If the metallization layer is not vacuum deposited, or if it is not vacuum deposited in the same pumpdown as the layers 34 and 36, then the buffer layer 36 plays an additional important adhesion role preventing delamination between the dielectric layer 34 and the metallization layer 30.

The substrate of the present invention lends itself to mass production of printer heads, as the plastic base material is available in rolls that can be semi-continuously processed to completed substrates. To form a substrate, a plastic sheet unwound from the roll is continuously passed into a series of deposition steps. The metallization layer 30, buffer layer 36, and dielectric layer 34 are successively deposited in a continuous fashion, as by sputtering or vapor deposition, or electroplating or electroless deposition for the metallic layers. This processing approach replaces the prior batch processing of substrate wafers, a significant improvement in view of the high production volume of printer heads. The resistor element layer is then applied to this prepared substrate material, followed by masking and deposition to produce the electrical leads. Vias can be formed through the substrate if desired, to permit backside electrical connection.

The substrate is then assembled with the orifice plate, heater elements, ink reservoir and other components to form the print head.

Print heads having the preferred construction have been fabricated and operated. For example, a print head was fabricated having the preferred structure of FIGS. 1 and 2. The print head had a base 28 of 0.004 inch thick Upilex-S polyimide plastic, a 400 Angstrom thick metallization layer 30 of chromium, a 1500 Angstrom thick buffer layer 36 of titanium, a 6000 Angstrom thick dielectric layer 34 of silicon dioxide, and a heater overlying these layers. Using an aqueous ink, a stable drop ejection of 80 picoliter volume drops was obtained at the high drop ejection frequency of 10 KHz (Kilohertz). At this frequency, 71 million droplets of ink were ejected from one such nozzle with no noticeable problems. In this structure, the metallization and buffer layers provide bonding and stress compatibility between the substrate and the dielectric, while the primary heat dissipation path is through the ink which is in direct contact with the resistor.

It will be appreciated that the approach of the invention yields important advantages in performance and fabricability as compared with prior approaches. Although a particular embodiment of the invention has been described in detail for purposes of illustration, various modifications may be made without departing from the spirit and scope of the invention. Accordingly, the invention is not to be limited except as by the appended claims.

What is claimed is:

1. A thermal ink jet printer print head, comprising:
   a plastic base;
   a metallization layer overlying the plastic base, the metallization layer having a thickness of from about 50 Angstroms to about 1000 Angstroms;
   a dielectric structure overlying the metallization layer, the dielectric structure including
      a metallic buffer layer overlying the metallization layer, the buffer layer having a thickness of greater than about 700 Angstroms, and
      a layer of a dielectric material overlying the metallic buffer layer;
   a resistor overlying the dielectric structure; and
   an orifice plate with an orifice therein and an ink channel overlying the thin film resistor and dielectric structure.

2. The print head of claim 1, wherein the plastic base is made of a polyimide plastic.

3. The print head of claim 1, wherein the metallization layer is chromium.

4. The print head of claim 1, wherein the metallization layer is chromium with a thickness of about 400 Angstroms.

5. The print head of claim 1, wherein the buffer layer is titanium.

6. The print head of claim 1, wherein the buffer layer is titanium in a thickness of about 1500 Angstroms.

7. The print head of claim 1, wherein the dielectric layer is aluminum oxide.

8. The print head of claim 1, wherein the dielectric layer is silicon dioxide.

9. The print head of claim 1, wherein the dielectric layer is from about 0.1 to about 10 micrometers thick.

10. A thermal ink jet printer print head, comprising:
    a plastic base;
    a chromium layer overlying the plastic base, the chromium layer having a thickness of from about 50 Angstroms to about 1000 Angstroms;
    a dielectric structure overlying the chromium layer, the dielectric structure including
       a titanium layer overlying the chromium layer, the titanium layer having a thickness of from about 700 to about 3000 Angstroms, and
       a layer of a dielectric material overlying the titanium layer, the dielectric material having a thickness of from about 0.1 to about 10 micrometers and being selected from the group consisting of aluminum oxide and silicon dioxide; and
    means overlying the dielectric structure for ejecting a droplet of ink.

11. The print head of claim 10, wherein the plastic base is made of a polyimide plastic.

12. The print head of claim 10, wherein the thickness of the chromium layer is about 400 Angstroms.

13. The print head of claim 10, wherein the thickness of the titanium layer is about 1500 Angstroms.

14. The print head of claim 10, wherein the thickness of the dielectric material is about 6000 Angstroms.

15. The print head of claim 10, wherein the means for ejecting includes an electrical resistor.

16. A thermal ink jet printer print head, comprising:
    a plastic base;
    a metallization layer overlying the plastic base, the metallization layer having a thickness of from about 50 Angstroms to about 1000 Angstroms;
    a dielectric structure overlying the metallization layer, the dielectric structure including
       a buffer layer overlying the metallization layer, the buffer layer having a thickness of greater than about 700 Angstroms, and
       a layer of a dielectric material overlying the metallic buffer layer; and
    means overlying the dielectric structure for ejecting a droplet of ink.

17. The print head of claim 16, wherein the metallization layer is chromium.

18. The print head of claim 16, wherein the buffer layer is made of titanium.

19. The print head of claim 16, wherein the dielectric material is selected from the group consisting of aluminum oxide and silicon dioxide.

* * * * *